United States Patent
Lee

(10) Patent No.: US 6,281,049 B1
(45) Date of Patent: Aug. 28, 2001

(54) SEMICONDUCTOR DEVICE MASK AND METHOD FOR FORMING THE SAME

(75) Inventor: Seung Ho Lee, Chungcheongbuk-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/219,528

(22) Filed: Dec. 23, 1998

(30) Foreign Application Priority Data

Jan. 14, 1998 (KR) ........................................ 98-866
Oct. 2, 1998 (KR) ................................... 98-41516

(51) Int. Cl.[7] ................................................ H01L 21/82
(52) U.S. Cl. ......................... 438/129; 438/599; 438/928
(58) Field of Search ................................ 438/691, 692, 438/599, 928, 321, 183, 401, 129; 257/758

(56) References Cited

U.S. PATENT DOCUMENTS

| | | | |
|---|---|---|---|
| 5,459,093 | * 10/1995 | Kuroda et al. | 438/599 |
| 5,652,465 | * 7/1997 | Hosoda et al. | 257/758 |
| 5,899,706 | * 5/1999 | Kluwe et al. | 438/129 |
| 6,103,626 | * 8/2000 | Kim | 438/691 |
| 6,169,314 | * 1/2001 | Wong et al. | 257/390 |

OTHER PUBLICATIONS

B.H. Roh et al., "Highly Manufacturable Shallow Trench Isolation for Giga Bit DRAM", Extended Abstracts of the 1995 International Conference on Solid State Devices and Materials, Osaka, 1995, pp. 590–592.

* cited by examiner

Primary Examiner—Long Pham
Assistant Examiner—William David Coleman
(74) Attorney, Agent, or Firm—Fleshner & Kim, LLP

(57) ABSTRACT

A semiconductor device mask and a method for forming the same is provided in which a mask pattern defines dummy active regions in isolating regions. The semiconductor device mask and method reduce surface unevenness and prevent damage to an active region, which have been problems in isolating devices by trenches. The semiconductor device mask includes real active pattern regions formed in regions defined as the active regions in a mask having an isolating region and the active regions. A plurality of dummy active pattern regions preferably spaced at fixed intervals from one another surrounding relatively isolated active regions and excluding gate pattern forming regions. The gate pattern forming regions are preferably formed extending in one direction across the isolating region and the real active pattern regions.

20 Claims, 6 Drawing Sheets

SEMICONDUCTOR DEVICE MASK AND METHOD FOR FORMING THE SAME

BACKGROUND OF THE INVENTION

1. Field of the Invention

The present invention relates to a semiconductor device, and more particularly, to a semiconductor device mask and a method for forming the same.

2. Background of the Related Art

FIG. 1A illustrates a plan view of a first background art composite mask using one mask for defining isolating regions and an active region and another mask for defining gate lines. FIG. 1B illustrates a cross-section of a semiconductor device of FIG. 1A along line I—I. FIG. 2 illustrates a plan view of a second background art composite mask using one mask for defining isolating regions and an active region and another mask for defining gate lines. Both of the background art composite masks define isolating regions and active regions to be used for isolating devices by means of shallow trench isolation.

Referring to FIG. 1A, the background art first mask defines an active region. The active region can include dense areas such as memory cells or a cell region and relatively sparse areas such as peripheral circuit regions (i.e., input/output circuits) or core regions (i.e., addressing circuits). As shown in FIG. 1A, a dense real active region is located to the left of a sparse real active region. The region other than the active region is defined as a region in which isolating regions are to be formed.

In the background art first mask, the cell region (e.g., dense) is patterned to have a narrow real active region, while the peripheral or the core region (e.g., sparse) is patterned to have a wide real active region. An isolating region in the cell region has a narrow width, while an isolating region between the cell region and the peripheral region (or core region) is defined to have a wider width. And, a gate line pattern region for forming gate lines crosses the isolating region.

A method and a structure for fabricating a device with trench isolating regions using the background art first mask will now be described with reference to FIGS. 1A–1B. First, an initial oxide film and a buffer nitride film are formed on a semiconductor substrate 1 and subjected to anisotropic etching using the background art first mask, to expose the semiconductor substrate 1 in which isolating regions are to be formed. Then, the semiconductor substrate 1 is etched to a prescribed depth to form a trench. An insulating material 2 is deposited to fill the trench isolating region, and subjected to annealing at a temperature above 1000° C. to make a wet etching rate almost the same with a wet etching rate of the insulating material 2 formed by thermal oxidation.

An additional nitride or polysilicon layer can be deposited to form a layer with increased flatness relative to the insulating material 2. A photoresist film is coated on the additional layer or the insulating material 2 and subjected to selective patterning by exposure and development. The additional layer and the insulating material 2 are etched using the patterned photoresist film as a mask to open the active region and leaving the photoresist film on the isolating region. Then, the additional layer and the insulating material 2 on the active region is subjected to anisotropic etching. The insulating material 2 and the additional layer are subjected to chemical mechanical polishing (CMP) for planarizing the insulating material 2 and removing the additional layer to expose the buffer nitride film. The nitride film is removed, and ions are injected into the semiconductor substrate 1 to form a well region in the active region. An oxide film and a polysilicon layer are deposited on an entire surface and subjected to anisotropic etching using the gate line forming mask, which is defined to cross the active region and the isolating region to form a gate oxide film 3 and the gate line 4.

As shown in FIG. 1B, since the wider region in the isolating region is not completely filled with the insulating material 2, it is difficult to perform the later processes with a flat surface. Further, the insulating material 2 in the wider region of the isolating region is removed to a greater degree than the insulating material 2 in the narrow region of the isolating region by chemical mechanical polishing, which produces a dishing effect. Further, voids can be formed in the trenches.

As shown in the background art second mask of FIG. 2, a region for forming dummy active regions is defined in an isolating region between the cell region and the peripheral region (or core region) of the first mask. The dummy active pattern region further defines the mask pattern region such that isolating regions are formed at regular intervals. When the background art second mask is applied in formation of a device, the device can be formed using a method identical to the method described above for the background art first mask in FIGS. 1A–1B.

As shown in FIG. 2, a device formed thus is provided with trench regions in the semiconductor substrate 1 at fixed intervals. In the background art second mask, the trench regions can be planarized without the dishing effect because the trench regions are at fixed intervals. The gate line is formed flat crossing the real active regions of the cell region and the peripheral region. In addition, the gate line is formed flat crossing the dummy active pattern region.

However, the background art semiconductor device masks and a semiconductor devices fabricated using the same have various problems. In the case of formation of device trench regions using the background art first mask, a micro-loading effect occurs because of differences in depths and angles of the trenches resulting from differences in widths of the trenches. The chemical mechanical polishing to form device trench regions using the background art first mask causes the dishing effect in the wider isolating regions that makes a flat surface difficult to achieve for later processes. Further, step differences between trench regions of narrow width and wide width are different to overcome in planarization of the trench regions by etch back after formation of the trench regions. In addition, a problem of a parasitic capacitance forming between the gate line and the dummy active region occurs when a device is fabricated using the background art second mask.

The above references are incorporated by reference herein where appropriate for appropriate teachings of additional or alternative details, features and/or technical background.

SUMMARY OF THE INVENTION

An object of the present invention is to provide a semiconductor device mask and a method for forming the same that substantially obviates one or more of the problems caused by limitations and disadvantages of the related art.

Another object of the present invention is to provide a semiconductor device mask and a method for forming the same that increases flatness and prevents damage to an active region Another object of the present invention is to provide a semiconductor device mask and a method for forming the same that reduces a parasitic capacitance of a gate line.

Another object of the present invention is to provide a semiconductor device mask and a method for forming the same that more rapidly produces a set of dummy active regions.

Another object of the present invention is to provide a semiconductor device mask and a method for forming the same that increases reliability of the semiconductor device.

Another object of the present invention is to provide a semiconductor device mask and a method for forming the same that maintains critical dimensions between real active regions and dummy active regions.

Another object of the present invention is to provide a semiconductor device mask and a method for forming the same that provides increased uniformity for etching angles of the active and inactive regions.

To achieve at least these objects and other advantages and in accordance with the purpose of the present invention, as embodied and broadly described, the semiconductor device mask includes real active regions, an isolating region formed surrounding the real active regions, a plurality of dummy active pattern regions formed in the isolating region, wherein the dummy active patterns surround the real active regions and gate regions extending along one direction, wherein the plurality of dummy active regions further exclude portions corresponding to the gate pattern forming regions.

To further achieve the above objects in a whole or in parts, there is provided method for forming a semiconductor device mask according to the present invention that includes forming real active regions, defining the real active regions as a current pattern, forming a first pattern region respectively surrounding the current pattern by increasing dimensions of the current pattern by a first prescribed amount, defining a second pattern region respectively surrounding the current pattern by increasing dimensions of the current pattern by a second prescribed amount, wherein the second prescribed amount is smaller than the first prescribed amount, removing the second pattern region from the first pattern region to form a dummy pattern region, defining the dummy pattern region as the current pattern, repeating the steps (c) through (f) to form a plurality of dummy pattern regions, summing the plurality of dummy pattern regions, defining gate line pattern regions, wherein the gate line pattern regions cross the real active regions, removing dummy pattern regions located in the gate line pattern regions from the summed dummy pattern regions to define a set of dummy active pattern regions and combining the real active pattern regions and the set of dummy active pattern regions to form the semiconductor device mask.

To further achieve the above objects in a whole or in parts, there is provided method for forming a semiconductor device mask according to the present invention that includes forming real active regions in a semiconductor substrate, wherein an isolating region is defined outside the real active regions, forming a first dummy region pattern surrounding the real active regions, forming a second dummy region pattern surrounding the first dummy region pattern to fill the isolating region, wherein the first and second dummy region patterns are made of dummy active patterns, defining gate line pattern regions, wherein the gate line pattern regions cross the real active regions, removing the dummy active pattern located in the gate line pattern regions from the first and second dummy region patterns to define a set of dummy active pattern regions and combining the real active pattern regions and the set of dummy active pattern regions to form the semiconductor device mask.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
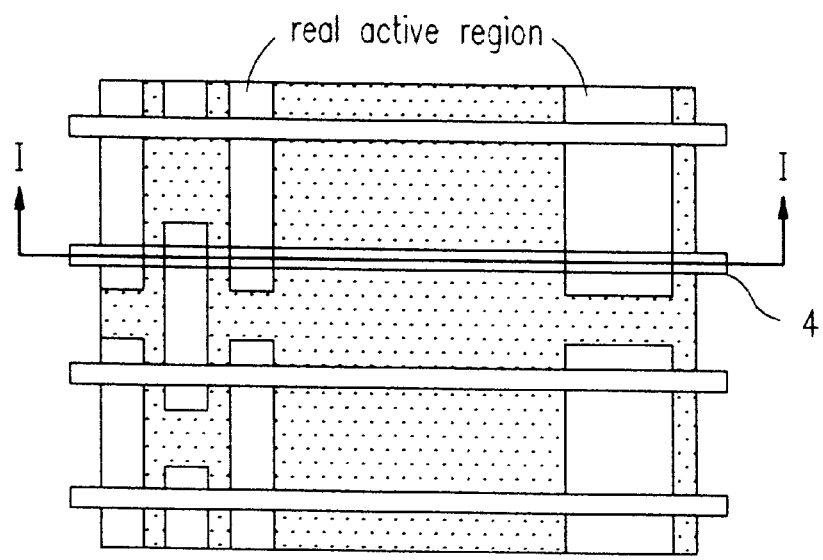
FIG. 1A is a diagram that illustrates a plan view of a background art composite mask including a mask that defines isolating regions and active regions and a mask that defines gate lines.
Figure 1B:
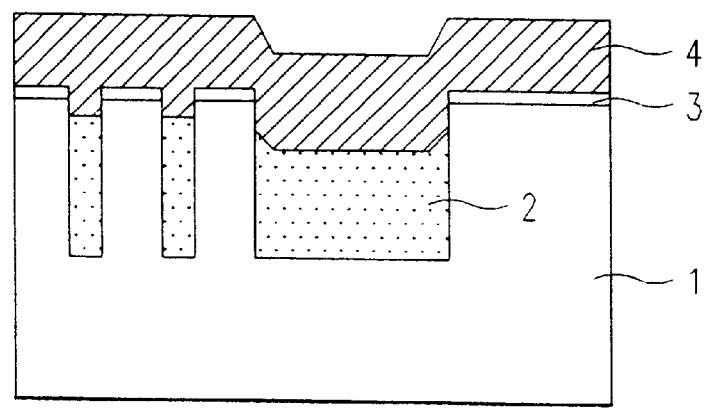
FIG. 1B is a diagram that illustrates a cross-section of a semiconductor device along line I—I formed using the mask of FIG. 1A.
Figure 2:
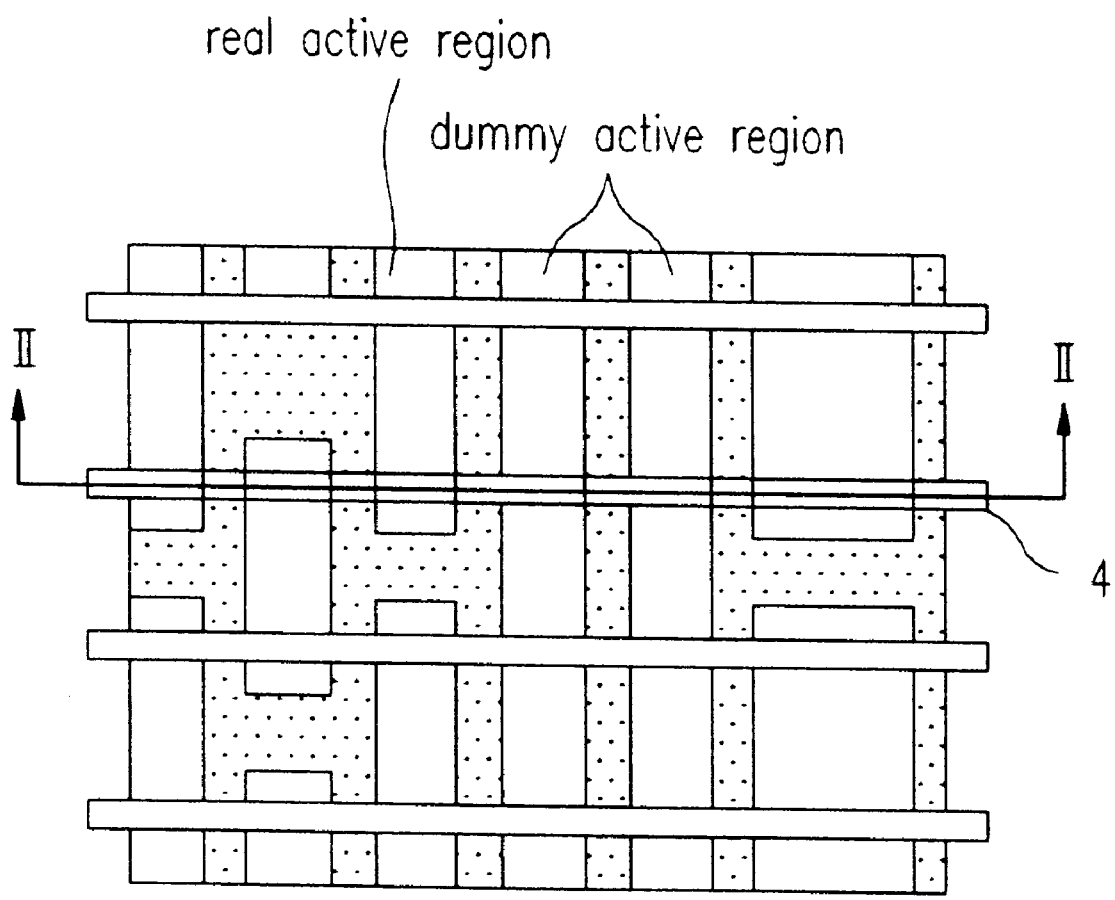
FIG. 2 is a diagram that illustrates a plan view of a background art composite mask including a mask that defines isolating regions and active regions and a mask that defines gate lines.
Figure 3:
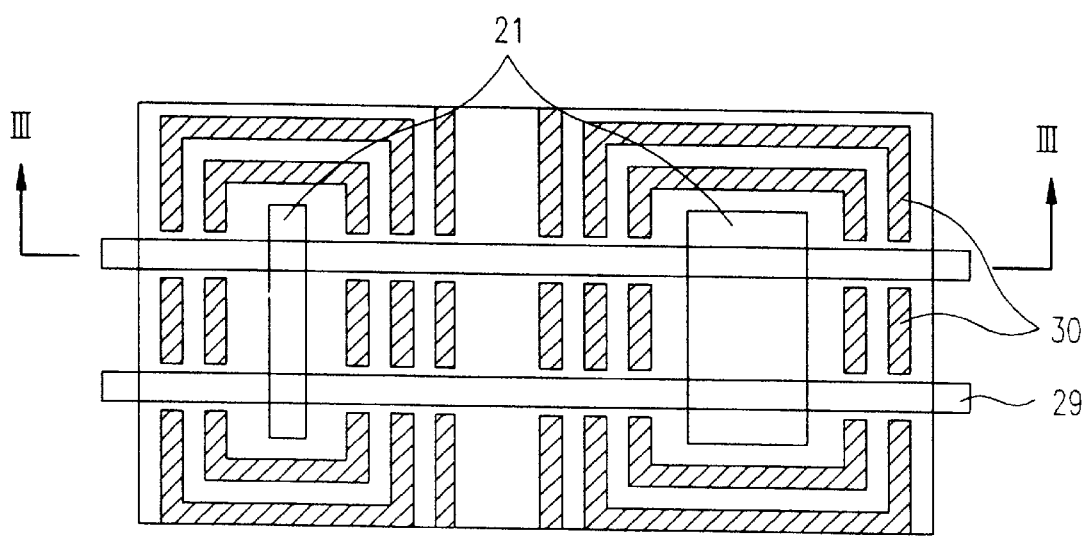
FIG. 3 is a diagram that illustrates a plan view of a composite of a mask defining isolating regions and active regions and a mask defining gate lines in accordance with a preferred embodiment of the present invention.

FIG. 3 is a diagram illustrating a plan view of a composite of a mask defining isolating regions and active regions and a mask defining a gate line in accordance with a first preferred embodiment of the present invention. FIGS. 4A–4E are diagrams illustrating a process for forming a semiconductor device mask in accordance with a second preferred embodiment of the present invention. The process according to the second preferred embodiment can be used, for example, to form a composite of a mask in accordance with the first preferred embodiment of the present invention.

Figure 4A:
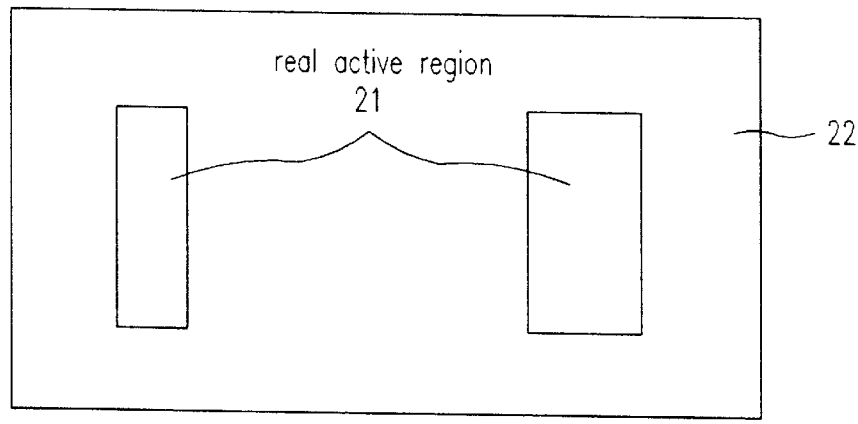
FIGS. 4A–4E are diagrams that illustrate steps in a preferred embodiment of a method of forming a semiconductor device mask according to the present invention.

Referring to FIG. 3, the semiconductor device mask in accordance with the first preferred embodiment of the present invention includes a real active pattern region 21 in each of a cell region and a peripheral (or core) region for respectively forming an active region therein. The real active pattern region 21 in the cell region is narrow while the real active pattern region 21 in the peripheral region is wide. A plurality of dummy active pattern regions 30 are preferably formed of segmented or complex rectangular shapes spaced from respective real active pattern regions 21 as well as from each other. The dummy active pattern regions are formed iteratively in an isolating region between the real active pattern region 21 of the cell region and the real active pattern region of the peripheral region. As shown in FIG. 4D, the dummy active pattern regions 30 are formed to leave regions for forming gate line pattern regions 29 intact. Each of the plurality of dummy active pattern regions 30 has a width preferably not less than a minimum width of the real active pattern region 21. A region defined as the gate line pattern region 29 preferably has a width not less than a minimum width of an isolating region 22.

A process for forming a semiconductor mask according to the second preferred embodiment of the present invention will now be described. Referring to FIG. 4A, a region can be defined in each of a cell region and peripheral region, where an active region is to be formed. A real active region 21 is formed in each of the active regions. The real active region 21 in the peripheral region has a width wider than a width of the real active region 21 in the cell region. The isolating region 22 is the region excluding the real active regions 21. Between the cell region and the peripheral region, the isolating region 22 is generally wide.

Figure 4B:
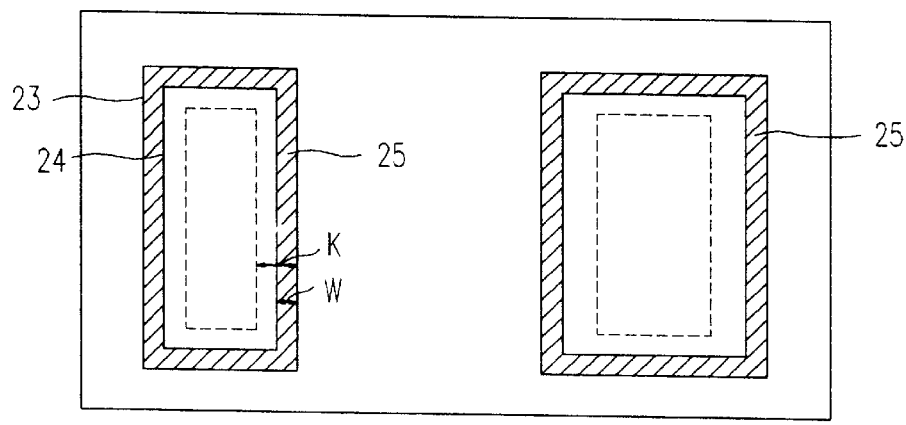

As shown in FIG. 4B, a first pattern region 23 is defined over-sizing by "k" the respective real active pattern regions 21. A second pattern region 24 is defined down sizing by "w" the respective first pattern regions 23. The downsized second pattern region 24 is subtracted from the oversized first pattern region 23 to form a first dummy pattern region 25.

Figure 4C:
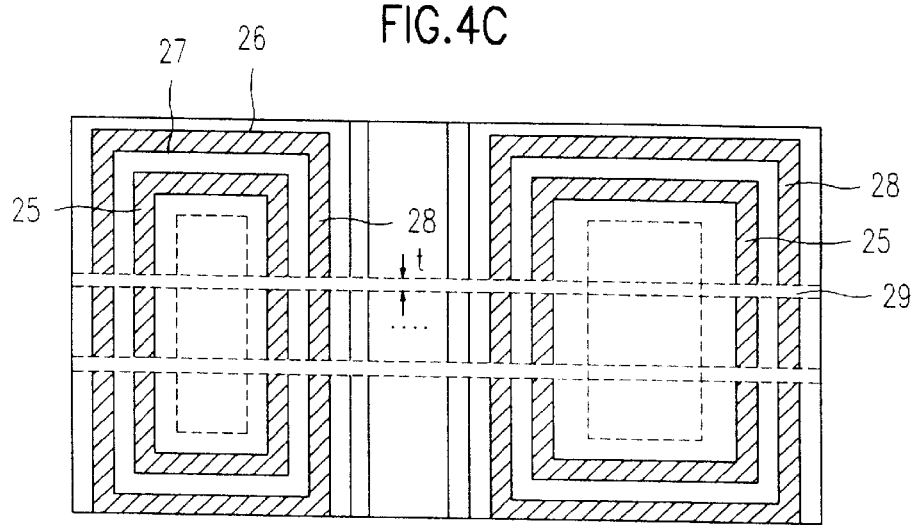
Figure 4D:
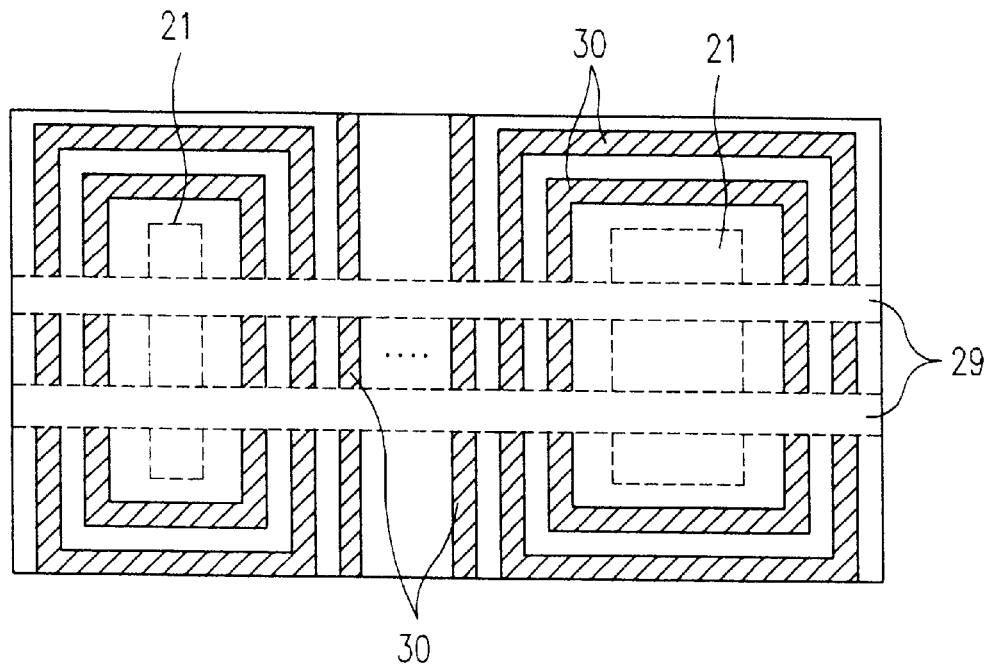

As shown in FIG. 4C, a third pattern region 26 is defined over-sizing the first pattern region 23. A fourth pattern region is defined down sizing the third pattern region 26, but the fourth pattern region is over-sized relative to the first pattern region 23. The fourth pattern region 27 is subtracted from the third pattern region 26 to form a second dummy pattern region 28.

The process to form a dummy active region can be repeated until a desired plurality of dummy pattern regions is formed. Both the first dummy pattern region 25 and the second dummy pattern region 28 preferably has a width greater than or the same with a minimum width of respective real active pattern regions 21. Gate line pattern regions 29 are defined each with a width "t" for forming gate lines.

As shown in FIG. 4D, a plurality of dummy pattern regions in the gate line pattern regions 29 are subtracted from a logical sum of the plurality of the dummy pattern regions and the gate line pattern regions 29, excluding the real active pattern regions 21, to form dummy active pattern regions 30. The gate line pattern region 29 preferably has a minimum width to electrically isolate the gate from the dummy active patterns in the isolating region 22.

Figure 4E:
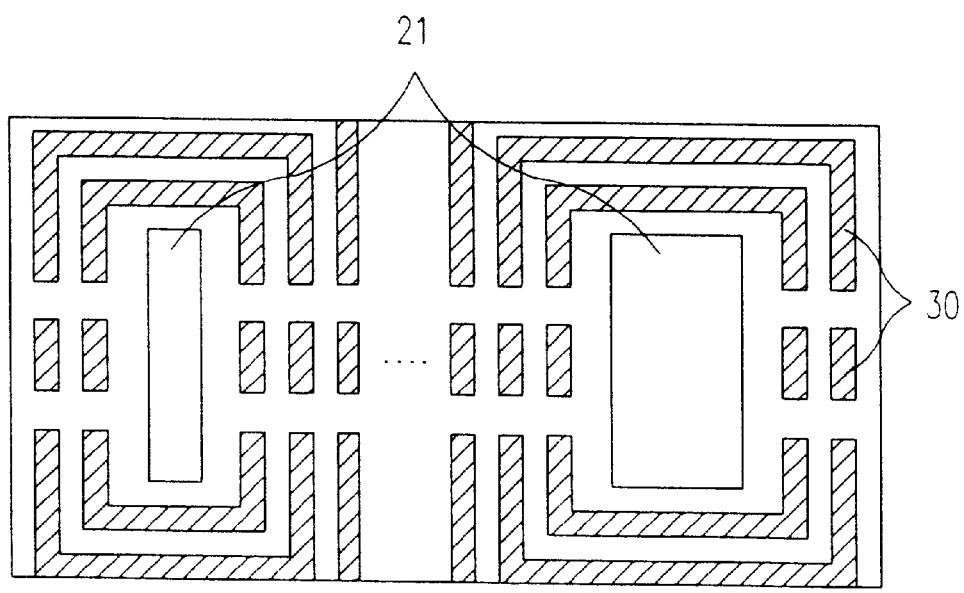

As shown in FIG. 4E, the dummy active pattern regions 30 in FIG. 4D and the real active pattern regions in FIG. 4A are logically summed, to form a final active pattern forming mask.

A method for fabricating a semiconductor device having a trench isolating region using the mask shown in FIG. 4E will now be described. An initial oxide film and a buffer nitride film are formed on a semiconductor substrate. A mask in accordance with preferred embodiments of the present invention is used in subjecting the initial oxide film and the buffer nitride film to anisotropic etching to expose a surface of the semiconductor substrate in which an isolating region is to be formed. The exposed surface of the semiconductor substrate is etched to a depth to form a trench region.

An insulating material is deposited to bury the trench region and subjected to reactive ion etching and/or chemical mechanical polishing (CMP) to planarize the insulating material. The buffer nitride film and the buffer oxide film are removed to expose the semiconductor substrate in the active region. Ions are injected into the semiconductor substrate to form a well region and a channel ion injecting process is conducted on the active region. An oxide film and a polysilicon layer are deposited on an entire surface and subjected to anisotropic etching to form a gate oxide film and a gate electrode.

Figure 5:
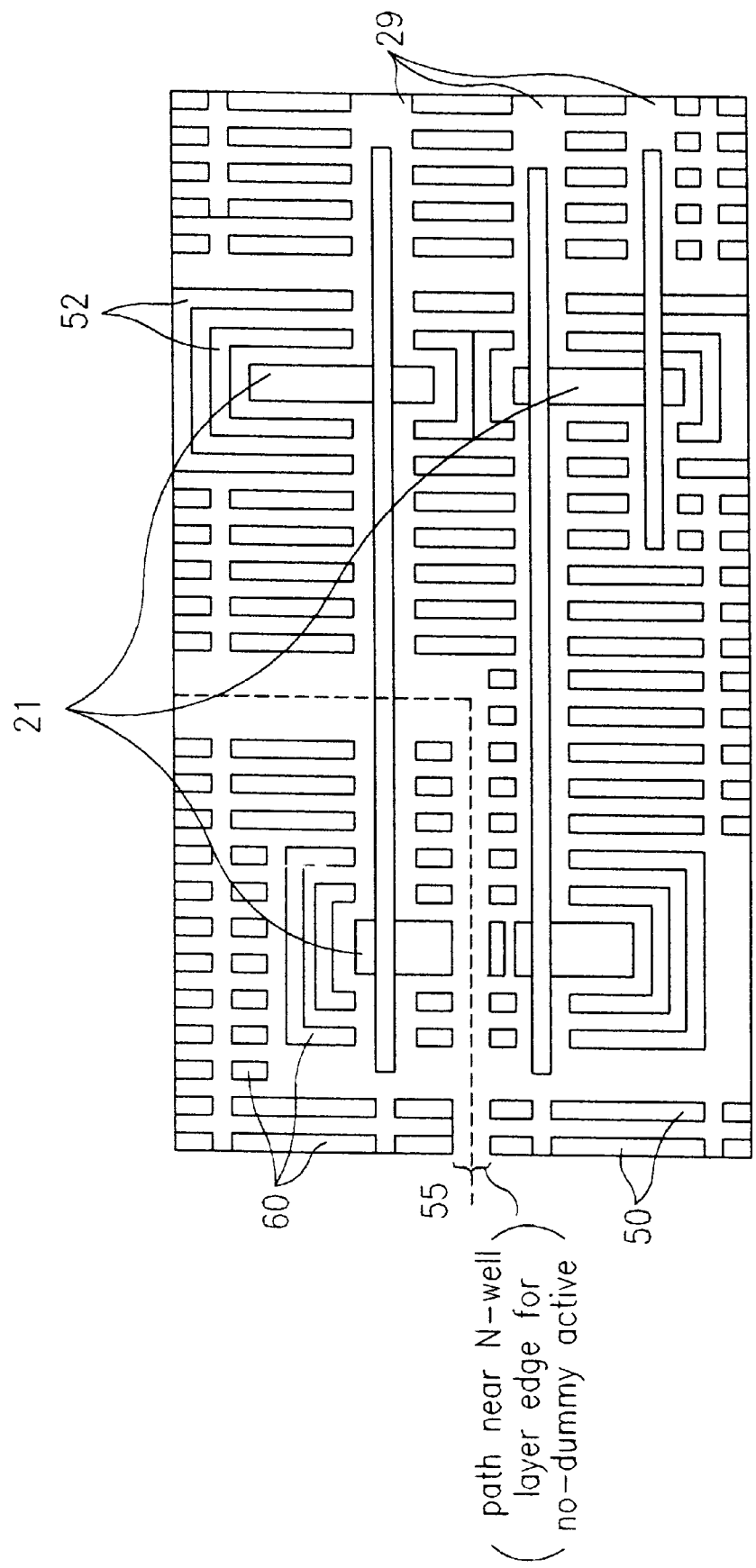
FIG. 5 is a diagram that illustrates a plan view of a composite of a mask defining isolating regions and active regions and a mask defining gate lines in accordance with another preferred embodiment of the present invention.

FIG. 5 is a diagram that illustrates a plan view of a composite of a mask defining isolating regions and active regions and a mask defining gate lines in accordance with a second preferred embodiment of the present invention. As shown in FIG. 5, at least two dummy region patterns are preferably used in the third embodiment.

As discussed above, dummy active patterns in relatively sparse field areas are required to sufficiently planarize a wafer surface for the shallow trench isolation process, which provides a uniform surface topography for a CMP process. The first preferred embodiment provides dummy active patterns generated from the real circuit active patterns. In the first preferred embodiment, the dummy active patterns serve as loading patterns to increase a photolithography process control of critical dimensions of a circuit device. However, the computation and compilation of the complex form of the dummy active patterns of the first preferred embodiment disadvantageously delays the photolithographic process.

In the second preferred embodiment, a first dummy active pattern 50 is determined to provide rapid calculation and formation while maintaining uniform dummy pattern density. A second dummy active pattern 52 is then determined to provide device functionality and control critical dimensions of the circuit device. For the first dummy active pattern 50, an array of dummy active rectangles 50 is created with the data center at the chip center (dummy active 0). The size of a rectangle and space between rectangles can vary depending upon a process design rule. According to the second preferred embodiment, a rectangle 50 size is preferably 2 $\mu$m by 20 $\mu$m and with a spacing of 4 $\mu$m. The second dummy active pattern 52 is preferably two iterations of dummy active region patterns surrounding the real active regions determined according to the first preferred embodiment of the present invention. As shown in FIG. 5, a plurality of dummy pattern regions in the gate line pattern regions 29 are subtracted from a logical sum of the plurality of the first and second dummy active patterns 50, 52 and the gate line pattern regions 29, excluding the real active pattern regions 21, to form dummy active pattern regions 60.

Further, when an ion implantation process to make source/drain region is applied and an implantation mask is generated from a real circuit active pattern, a photoresist is opened only on real active regions and other areas on the field region are covered. During ion implantation, a positive charge can be created, which tends to flow into the open windows of the photoresist. The relatively accumulated positive charge on a real active region can cause a gate oxide degradation problem. Beneficially, during an implantation process of a device having dummy active regions, the positive charge can flow into additional open windows over the dummy active regions. Accordingly, such charging problems can be solved by generating an implantation mask from the real active and the dummy active regions as well.

The first or second preferred embodiments can further be modified to increase device reliability and functionality. After a dummy active generation rule is completed, the data can contain dummy "slivers" smaller than a minimum allowable active size. If such slivers exist, the slivers can cause a particle source during inspecting a fabricated mask. One method of solving the sliver problem is to down-size the final generated data and then over-size the final data again to recover the data. Any slivers down-sized to a vertical or horizontal line or dot is eliminated before the over-sizing occurs to recover the final generated data.

Generating dummy active regions over inter-well field areas can also decrease device reliability. For example, if a dummy active is created in N-well edge region during generating dummy active patterns, an electrical short can occur between an N-type side in an N-well and a P-type side in a P-well within the dummy active region when a SALICIDE (Self ALIgned siliCIdation) process is used. That is, the silicided metal on the top of the dummy active on the N-well edge acts as an interconnecting metal between N-type and P-type actives within the dummy active region. One method of solving the inter-well problem is to not initially create or eliminate any dummy active data near an inter-well edge. For example, dummy active regions generated by patterns within a path having a width of 1 μm over an inter-well edge. The path can be generated, for example, by subtracting the data (over-sizing the N-well edge with 0.5 μm minus the data after down-sizing the N-well edge with 0.5 μm) from the final generated dummy active data.

In summary, FIG. 5 shows a mask having dummy active regions (DARs) conforming to prescribed process design rules for circuit device fabrication. First, an array of dummy active rectangles is created with a data center at the wafer or chip center to form dummy active pattern 0. The size of a rectangle and space between rectangles preferably varies depending upon a process design rule. Then, real circuit active patterns (RCAPs) are over-sized (e.g., by 3.8 μm per edge) to form dummy active pattern 1. The dummy active pattern 1 will be subtracted from the dummy active pattern 0 (e.g., rectangles) to eliminate DARs within the up-sized real circuit active patterns. Next, the real circuit active pattern (RCAP) is over-sized by 1.6 μm (dummy active pattern 2') and then over-sized by 0.6 μm (dummy active pattern 2"), and the dummy active 2" is subtracted from dummy active pattern 2' to form dummy active pattern 2, which is the first DAR surrounding the real circuit active patterns. The real circuit active pattern (RCAP) is then over-sized by 3.2 μm (dummy active pattern 3'), and over-sized by 2.2 μm (dummy active 3"), and the dummy active pattern 3" is subtracted from dummy active pattern 3' to form dummy active pattern 3, which is the second DAR surrounding the real circuit active patterns. The two dummy active patterns generated from the real circuit active patterns preferably serve as loading patterns to improve a photolithography process to control critical dimensions of a circuit device.

Next, N-well edge are over-sized by 0.5 μm per side and down-sized by 0.5 μm per side, and the down-sized generated N-well data is subtracted from the over-sized N-well data to form dummy active pattern 4. Thus, the dummy active pattern 4 generates a path surrounding the N-well edge. Further, block patterns can be formed as dummy active pattern 5 to cover any process monitoring pattern or unwanted dummy active pattern area. The gate electrode layer (for example, poly layer) is over-sized by 0.15 μm per edge to form dummy active pattern 6. Dummy active patterns 1, 4 and 5 are subtracted from dummy active pattern 0 to form dummy active pattern 7. The final active patterns can then be determined as follows: (RCAP) ∪ {DAP2 ∪ DAP3 ∪ DAP7-DAP6}. In other words, dummy active patterns 2, 3 and 6 are added, duumy active pattern 6 is subtracted (i.e., the gate electrode pattern), and the result is merged with the original real circuit active patterns. Finally, merged active patterns is sized down by 0.07 μm and then again sized up by 0.07 μm to remove any possible dummy active slivers after generating the final active patterns.

The preferred embodiments of a semiconductor device mask and a method for forming the same according to the present invention have various advantages. The fixed widths of the trenches obtainable by using a mask according to the preferred embodiments allows CMP to be conducted irrespective of a device packing density (e.g., sparse or dense) of the mask pattern. The planarization by reactive ion etching in place of the CMP information of the trench regions by using a mask of the preferred embodiments simplifies the fabrication process and can improve a uniformity of subsequent fabrication processes. The fixed widths of the trenches obtainable by using a mask of the preferred embodiments eliminates the micro-loading effect in which depths and sidewall angles of trenches are varied. Forming no gate line in the dummy active pattern regions in the isolating region prevents parasitic capacitance. Separate forming and combining of the real active pattern regions and the dummy active pattern regions eliminates difficulty in correcting the mask. Further, damages to edge portions in the real active pattern regions or clipping of the real active pattern regions from excessive sputtering in conduction of a high concentration plasma chemical vapor deposition can be prevented.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A method for forming a semiconductor device mask, comprising:
   forming real active regions;
   defining the real active regions as a current pattern;
   forming a dummy pattern, comprising:
      forming a first pattern region respectively surrounding the current pattern by increasing dimensions of the current pattern by a first prescribed amount,
      defining a second pattern region respectively surrounding the current pattern by increasing dimensions of the current pattern by a second prescribed amount, wherein the second prescribed amount is smaller than the first prescribed amount,
      removing the second pattern region from the first pattern region to form a dummy pattern region, and
      defining the dummy pattern region as the current pattern;
   forming a plurality of dummy pattern regions by repeatedly forming dummy patterns as set forth above;
   summing the plurality of dummy pattern regions;
   defining gate line pattern regions, wherein the gate line pattern regions cross the real active regions;
   removing dummy pattern regions located in the gate line pattern regions from the summed dummy pattern regions to define a set of dummy active pattern regions, where the set of dummy active pattern regions leave regions for forming gate line pattern regions intact; and
   combining the real active regions and the set of dummy active pattern regions to form the semiconductor device mask.

2. The method of claim 1, wherein dummy regions are isolated from the real active regions, and wherein the summed dummy pattern regions fill the semiconductor device mask excluding the real active regions.

3. The method of claim 1, further comprising defining real active pattern regions in the real active regions, wherein the dummy active pattern regions have a width not less than the real active pattern regions, and wherein the gate line pattern regions extend along a prescribed direction and have fixed widths.

4. The method of claim 1, wherein the gate line pattern regions have a width based on an electrical isolation distance to reduce parasitic capacitance.

5. The method of claim 1, wherein an isolating region is defined outside the real active regions, and wherein the plurality of dummy pattern regions form a first pattern of dummy regions, further comprising:

forming a second dummy region pattern surrounding the first dummy region pattern to fill the isolating region, wherein the second dummy region patterns is made of dummy active patterns;

removing the dummy active pattern located in the gate line pattern regions from the second dummy region patterns to define an additional set of dummy active pattern regions; and combining the real active pattern regions, the set of dummy active pattern regions and the additional set of dummy active pattern regions to form the semiconductor device mask.

6. The method of claim 5, wherein the forming a second dummy region pattern, comprises:

defining a center point of the mask; and determining an array of rectangularly shaped dummy active patterns having a prescribed size and spacing.

7. A method for forming a semiconductor device mask, comprising:

forming real active regions in a semiconductor substrate, wherein an isolating region is defined outside the real active regions;

forming a first dummy region pattern surrounding the real active regions;

forming a second dummy region pattern surrounding the first dummy region pattern to fill the isolating region, wherein the first and second dummy region patterns are made of dummy active patterns;

defining gate line pattern regions, wherein the gate line pattern regions cross the dummy active regions;

removing the dummy active pattern located in the gate line pattern regions from the first and second dummy region patterns to define a set of dummy active pattern regions;

combining the real active regions and the set of dummy active pattern regions to form the semiconductor device mask; and removing dummy active patterns from a region having a prescribed shape to cover inter-well edges from the set of dummy active pattern regions.

8. The method of claim 7, wherein the forming a first dummy region pattern, comprises:

defining the real active regions as a current pattern;

forming a first pattern region respectively surrounding the current pattern by increasing dimensions of the current pattern by a first prescribed amount;

defining a second pattern region respectively surrounding the current pattern by increasing dimensions of the current pattern by a second prescribed amount, wherein the second prescribed amount is smaller than the first prescribed amount;

removing the second pattern region from the first pattern region to form a dummy pattern region;

defining the dummy pattern region as the current pattern;

repeating the forming a first pattern region steps through the defining the dummy pattern region as the current pattern step to form the first dummy region pattern.

9. The method of claim 7, wherein the forming a second dummy region pattern, comprises:

defining a center point of the mask; and determining an array of rectangularly shaped dummy active patterns having a prescribed size and spacing.

10. The method of claim 9, wherein the dummy active regions are isolated from the real active regions, and wherein the rectangularly shaped dummy active patterns are 2 $\mu$m by 20 $\mu$m and with a spacing of 4 $\mu$m.

11. The method of claim 7, wherein the gate line pattern regions have a width based on an electrical isolation distance to reduce parasitic capacitance.

12. The method of claim 7, further comprising removing slivers from the set of dummy active pattern regions.

13. The method of claim 1, further comprising removing dummy pattern regions from a region having a prescribed shape to cover inter-well edges from the set of dummy active pattern regions.

14. The method of claim 1, wherein each of the dummy active pattern regions has a width not less than a minimum width of a real active pattern region.

15. A method for forming a semiconductor device mask, comprising:

forming real active pattern regions in real active regions in a semiconductor substrate, wherein an isolating region is defined outside the real active regions;

forming a first dummy region pattern surrounding the real active regions;

forming a second dummy region pattern surrounding the first dummy region pattern to fill the isolating region, wherein the first and second dummy region patterns are made of dummy active patterns;

defining gate line pattern regions, wherein the gate line pattern regions cross the real active regions;

removing the dummy active pattern located in the gate line pattern regions from the first and second dummy region patterns to define a set of dummy active pattern regions;

combining the real active pattern regions and the set of dummy active pattern regions to form the semiconductor device mask; and removing slivers from the set of dummy active pattern regions.

16. A method for forming a semiconductor device mask, comprising:

forming real active regions in a semiconductor substrate, wherein an isolating region is defined outside the real active regions;

forming a first dummy region pattern surrounding the real active regions;

forming a second dummy region pattern surrounding the first dummy region pattern to fill the isolating region, wherein the first and second dummy region patterns are made of dummy active patterns;

defining underlying and overlying conductive pattern regions, wherein one of the underlying and overlying conductive pattern regions cross a dummy active pattern of the first and second dummy region patterns;

completely removing the dummy active pattern located in said one of the underlying and overlying conductive pattern regions from the first and second dummy region patterns to define a set of dummy active pattern regions; and combining the real active regions and the set of dummy active pattern regions to form the semiconductor device mask.

17. The method of claim 16, further comprising removing dummy active patterns from a region having a prescribed shape to cover inter-well edges from the set of dummy active pattern regions.

18. The method of claim 16, further comprising removing slivers from the set of dummy active pattern regions.

19. The method of claim 16, wherein the underlying conductive pattern regions include inter-well edges, and wherein the overlying conductive pattern regions include gate line pattern regions.

20. The method of claim 16, wherein the overlying conductive pattern regions include gate line pattern regions.

* * * * *